United States Patent
Chen

(10) Patent No.: US 12,028,080 B2
(45) Date of Patent: Jul. 2, 2024

(54) CLOCK GENERATING CIRCUIT AND METHOD FOR GENERATING CLOCK SIGNAL

(71) Applicant: Realtek Semiconductor Corp., HsinChu (TW)

(72) Inventor: Tsung-Ming Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 56 days.

(21) Appl. No.: 18/096,565

(22) Filed: Jan. 13, 2023

(65) Prior Publication Data

US 2023/0253973 A1 Aug. 10, 2023

(30) Foreign Application Priority Data

Feb. 10, 2022 (TW) .................................. 111104930

(51) Int. Cl.
*H03L 7/091* (2006.01)
*G06F 1/08* (2006.01)

(52) U.S. Cl.
CPC ................. *H03L 7/091* (2013.01); *G06F 1/08* (2013.01)

(58) Field of Classification Search
CPC ............. G06F 1/06; G06F 1/08; H03H 11/16; H03K 5/00; H03K 5/02; H03K 5/15; H03K 5/135; H03L 7/08; H03L 7/081; H03L 7/091; H03L 7/0807; H04L 7/00; H04L 7/04; H04L 7/033; H04L 7/0025; H04L 7/0037
USPC ............... 327/115, 175, 231, 233, 237, 258; 375/219, 295, 316, 354, 355, 376
See application file for complete search history.

(56) References Cited

U.S. PATENT DOCUMENTS

| | | | |
|---|---|---|---|
| 2008/0272948 A1 | 11/2008 | Dabag | |
| 2018/0152190 A1* | 5/2018 | Song | H03L 7/0807 |
| 2023/0114988 A1* | 4/2023 | Kim | H03L 7/0807 |
| | | | 375/354 |

FOREIGN PATENT DOCUMENTS

CN 101310440 A 11/2008

OTHER PUBLICATIONS

Ali K. Nahar, Data Weighted Averaging (DWA) Technique with 1st order Noise-shaping to Improve 6 bit Digital-to-Analog Convertor (DAC) Performance, Apr. 2013, No. (5), Vol. (21), Journal of University of Babylon for Engineering Sciences ,Apr. 2013.

(Continued)

*Primary Examiner* — Shawkat M Ali
(74) *Attorney, Agent, or Firm* — Winston Hsu

(57) ABSTRACT

A clock generating circuit includes a control circuit and a phase interpolator. The control circuit converts an input signal to generate an encoded signal having multiple bits and adjusts arrangement of the bits according to a pointer to generate a control signal having multiple control bits. The phase interpolator includes a first driving circuit, a second driving circuit and an output terminal configured to output an interpolated clock signal. The first driving circuit receives a first clock signal and includes multiple first driving units that are turned on or off to drive the first clock signal in response to multiple first control bits in the control bits. The second driving circuit receives a second clock signal and includes multiple second driving units that are turned on or off to drive the second clock signal in response to multiple second control bits in the control bits.

16 Claims, 9 Drawing Sheets

(56) References Cited

OTHER PUBLICATIONS

Pavan Kumar Hanumolu, A Sub-Picosecond Resolution 0.5-1.5 GHz Digital-to-Phase Converter, Feb. 2008, p. 414, vol. vol. 43, No. 2, IEEE Journal of Solid-State Circuits ,Feb. 2008.

* cited by examiner

(12) United States Patent US 12,028,080 B2

CLOCK GENERATING CIRCUIT AND METHOD FOR GENERATING CLOCK SIGNAL

BACKGROUND OF THE INVENTION

1. Field of the Invention

The invention relates to a clock generating circuit, more particular to a clock generating circuit capable of reducing phase errors caused by device mismatch.

2. Description of the Prior Art

A phase interpolator is a circuit that uses two clock sources with the same frequency to generate a multi-phase clock signal. The phase interpolator generates an interpolated clock signal by interpolating the two input clock signals.

The phase interpolator usually includes a plurality of fundamental devices for providing current or voltage, and uses the fundamental devices to respectively control the driving capabilities of the two clock signals, so that the phases of the output clock signals can be adjusted accordingly.

However, characteristic difference, or may be regarded as the device mismatch, inevitably exists between fundamental devices. With mismatched devices, the phase interpolator would be unable to accurately control the phase of the output clock signal. In view of this, a novel clock generating circuit, which is capable of reducing phase errors caused by device mismatch so as to effectively solve the above problems, is highly required.

SUMMARY OF THE INVENTION

It is an objective of the invention to provide a clock generating circuit and an associated method for generating a clock signal to reduce the phase errors caused by device mismatch and accurately control the phase of the output clock signal.

According to an embodiment of the invention, a clock generating circuit comprises a control circuit and a phase interpolator. The control circuit is configured to receive and convert an input signal to generate an encoded signal comprising a plurality of bits, and adjust arrangement of the plurality of bits of the encoded signal according to a pointer to generate a control signal comprising a plurality of control bits. The phase interpolator is configured to receive a first clock signal, a second clock signal and the control signal and comprises a first driving circuit, a second driving circuit and an output terminal. The first driving circuit is configured to receive the first clock signal and comprises a plurality of first driving units. The plurality of first driving units are turned on or off to drive the first clock signal in response to a plurality of first control bits in the plurality of control bits. The second driving circuit is configured to receive the second clock signal and comprises a plurality of second driving units. The plurality of second driving units are turned on or off to drive the second clock signal in response to a plurality of second control bits in the plurality of control bits. The output terminal is coupled to the first driving circuit and the second driving circuit and configured to output an interpolated clock signal.

According to another embodiment of the invention, a method for generating a clock signal comprising: converting an input signal to generate an encoded signal comprising a plurality of bits; adjusting arrangement of the plurality of bits of the encoded signal according to a pointer to generate a control signal comprising a plurality of control bits; and generating an interpolated clock signal according to a first clock signal, a second clock signal and the control signal. In step of generating the interpolated clock signal according to the first clock signal, the second clock signal and the control signal, a plurality of first driving units of a phase interpolator and a plurality of second driving units of the phase interpolator are respectively turned on or off in response to a plurality of first control bits and a plurality of second control bits in the plurality of control bits to respectively drive the first clock signal and the second clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
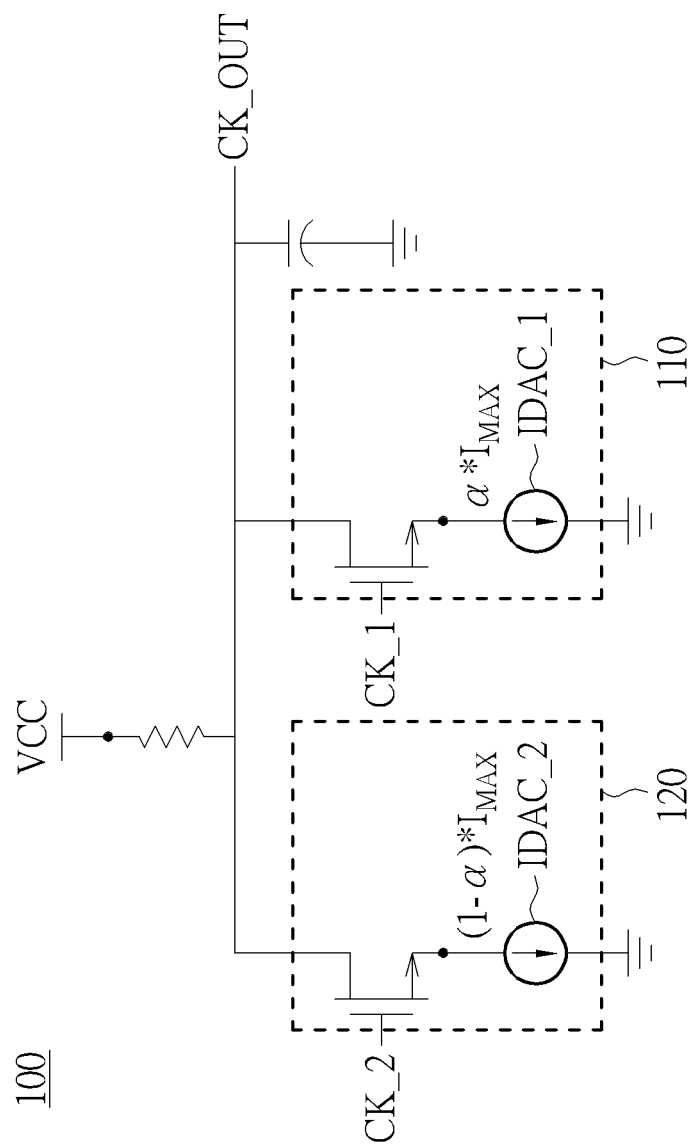
FIG. 1 shows an exemplary circuit diagram of a phase interpolator according to an embodiment of the invention.

FIG. 1 shows an exemplary circuit diagram of a phase interpolator according to an embodiment of the invention. In this embodiment, the phase interpolator is a current type phase interpolator. The phase interpolator 100 may comprise a driving circuit 110 and a driving circuit 120. The driving circuits 110 and 120 are coupled to the voltage source VCC, and may respectively comprise an input stage, such as a transistor, for receiving the corresponding first clock signal CK_1 and the second clock signal CK_2, and an adjustable current source, such as the current sources IDAC_1 and IDAC_2. The phase interpolator 100 controls the magnitude of the current sources according to the control values $\alpha$ and $(1-\alpha)$, so as to accordingly control a driving strength of the first clock signal CK_1 and a driving strength of the second clock signal CK_2. In this embodiment, it is assumed that the control value corresponding to the first clock signal CK_1 is $\alpha$ and the control value corresponding to the second clock signal CK_2 is $(1-\alpha)$, and it is assumed that the maximum current provided by the current sources IDAC_1 and IDAC_2 is IMAX, the driving current conducted in the driving circuit 110 is α*IMAX, and the driving current conducted in the driving circuit 120 is (1−α)*IMAX. The phase interpolator 100 generates an interpolated clock signal at an output terminal according to the driving result of the first clock signal CK_1 and the second clock signal CK_2.

Figure 2:
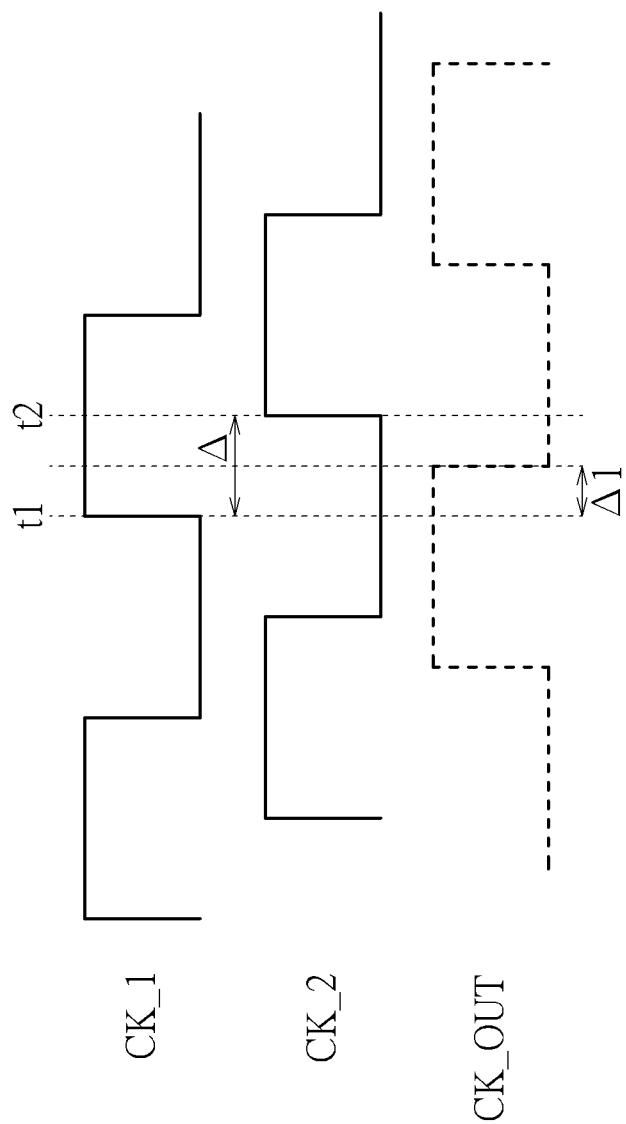
FIG. 2 shows exemplary waveforms of the signals according to an embodiment of the invention.

FIG. 2 shows exemplary waveforms of the signals according to an embodiment of the invention. The first clock signal CK_1 and the second clock signal CK_2 are two clock signals having the same frequency but with a phase difference. Therefore, the two clock signals have the same waveform, but their rising edges/falling edges are not aligned. Assuming that a rising edge of the first clock signal CK_1 occurs at time t1, and a rising edge of the second clock signal CK_2 occurs at time t2 later than t1, the first clock signal CK_1 has a leading phase with respect to the second clock signal CK_2, and there is a time difference Δ between the rising edge/falling edge of the two clock signals. The time/phase difference between the rising edge/falling edge of the output clock signal CK_OUT generated by the phase interpolator and the first clock signal CK_1 may be Δ1, where Δ1 is smaller than Δ, and Δ1 is related to the control value α. As an example, the greater the control value α, the smaller the time difference Δ1 is. In other words, the greater the control value α corresponding to the first clock signal CK_1 is, the closer the rising edge/falling edges of the output clock signal CK_OUT generated by the phase interpolator and the first clock signal CK_1 would be.

According to an embodiment of the invention, the driving circuit of the phase interpolator, for example, the driving circuits 110 and 120 as shown in FIG. 1, may respectively comprise a plurality of driving units, and the driving units are respectively turned on or off in response to a corresponding control bit of the control signals Ctrl_Sig, so as to drive the corresponding clock signal. When the amount of driving current conducted in the driving circuit is changed, the driving strength of the clock signal changes accordingly. For example, when the amount of current for driving the first clock signal CK_1 increases, the driving strength of the first clock signal CK_1 increases as well, so that the phase of the interpolated clock signal will be closer to the first clock signal CK_1.

Figure 3:
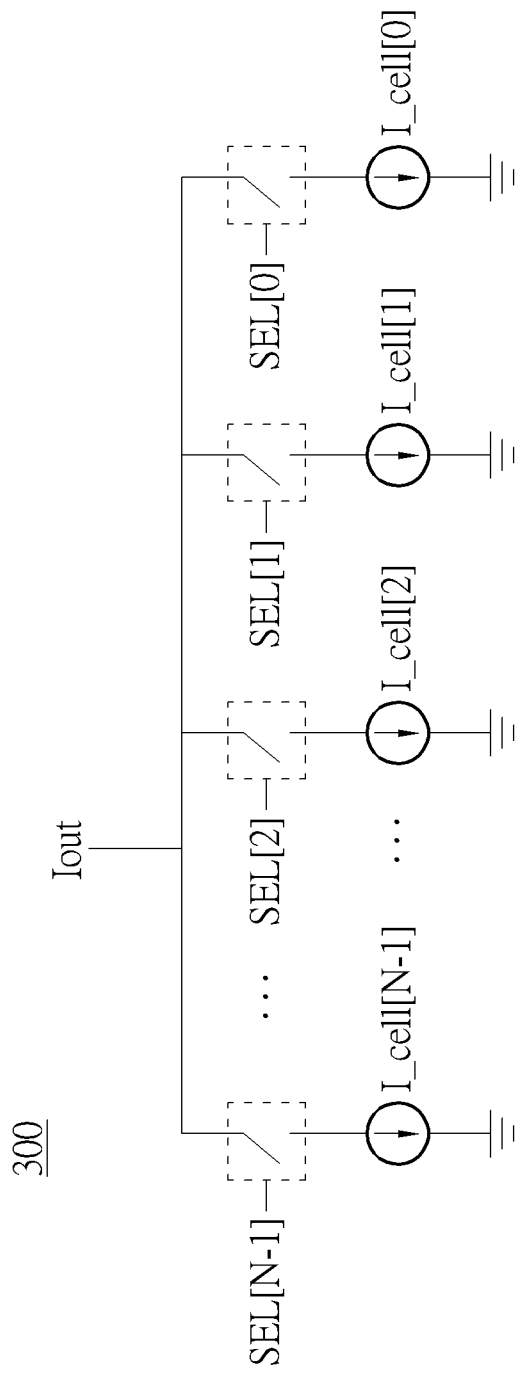
FIG. 3 shows an exemplary circuit diagram of a current-type driving circuit according to an embodiment of the invention.

FIG. 3 shows an exemplary circuit diagram of a current-type driving circuit according to an embodiment of the invention. The driving circuit 300 may comprise a plurality of driving units, and each driving unit may comprise current sources I_cell[0], I_cell[1], I_cell[2] ... I_cell[N−1] and a corresponding switch device as shown in FIG. 3, where N is a positive integer. In this embodiment, the current sources I_cell[0]~I_cell[N−1] are designed as current sources of the same size, therefore, the current sources I_cell[0]~I_cell[N−1] may theoretically provide the same amount of current.

The switch device in each driving unit may be switched on or off in response to a corresponding control bit in the control signal, such as one of the control bits SEL[0], SEL[1], SEL[2] ... SEL[N−1] as shown in FIG. 3, thereby controlling the magnitude of the driving current Iout conducted by the driving circuit 300, wherein the driving current Iout may correspond to the driving current α*IMAX generated by the current source IDAC_1 of the driving circuit 110 or the driving current (1−α)*IMAX generated by the current source IDAC_2 of the driving circuit 120 shown in FIG. 1, or in another embodiment of the invention, a summation of the driving current generated by a portion of the current sources I_cell[0]~I_cell[N−1] may be equivalent to the driving current generated by the current source IDAC_1, and a summation of the driving current generated by the other portion of the current sources may be equivalent to the driving current generated by the current source IDAC_2. That is, the two clock signals may share the same driving circuit.

As shown in FIG. 3, the switch device coupled to the current source I_cell[0] may be turned on or off in response to the current setting value of the control bit SEL[0]. When the switch device is turned on, it is equivalent to that the corresponding driving unit is turned on, and the driving current Iout generated by the driving circuit 300 includes the current provided by the current source I_cell[0]. Conversely, when the switch device is turned off, it is equivalent to that the corresponding driving unit is turned off, and the resulting driving current Iout will not include the current provided by the current source I_cell[0]. The control of the remaining current sources may be deduced by analogy.

Although the current source of each driving unit theoretically provides the same amount of current, due to the inevitable characteristic difference or mismatch between electrical devices, the amount of current generated by the current source designed to be the same size may not necessarily be the same. Therefore, it is difficult to precisely control the magnitude of the driving current conducted by the driving circuit.

In view of this, the invention provides a clock generating circuit, which is capable of reducing phase errors caused by device mismatch, to effectively solve the above problems.

Figure 4:
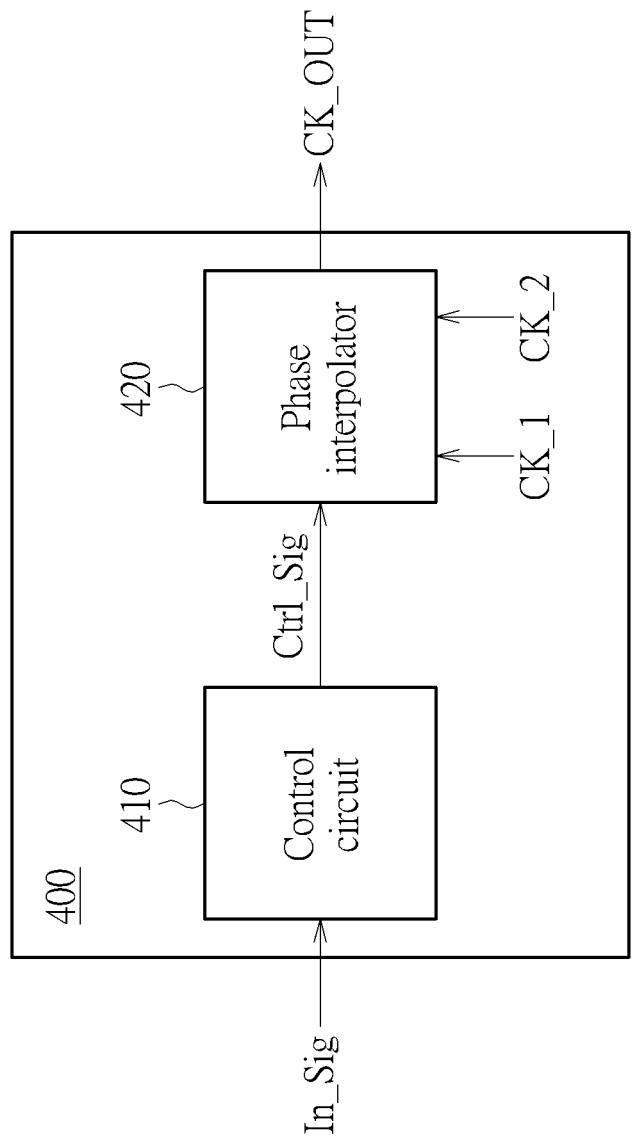
FIG. 4 shows an exemplary block diagram of a clock generating circuit according to an embodiment of the invention.

FIG. 4 shows an exemplary block diagram of a clock generating circuit according to an embodiment of the invention. The clock generating circuit 400 may comprise a control circuit 410 and a phase interpolator 420. The control circuit 410 is configured to receive an input signal In_Sig and generate a control signal Ctrl_Sig comprising a plurality of control bits according to the input signal In_Sig. The phase interpolator 420 is coupled to the control circuit 410 and configured to receive a first clock signal CK_1, a second clock signal CK_2 and the control signal Ctrl_Sig, and generates an output clock signal CK_OUT according to the first clock signal CK_1, the second clock signal CK_2 and the control signal Ctrl_Sig. The output clock signal CK_OUT is equivalent to an interpolated clock signal generated by interpolating the first clock signal CK_1 and the second clock signal CK_2 as described above, thus it may also be called an interpolated clock signal.

The input signal In_Sig may be provided by an external logic circuit and the first clock signal CK_1 and the second clock signal CK_2 may be provided by an external clock source. The input signal In_Sig may indicate a strength (driving strength) of at least one of the first clock signal CK_1 and the second clock signal CK_2, or a ratio of strength of the first clock signal CK_1 to the second clock signal CK_2. The ratio of strength may also be regarded as a ratio of the weighing of the first clock signal CK_1 to the weighing of the second clock signal CK_2 when the interpolated clock signal is generated according to the first clock signal CK_1 and the second clock signal CK_2. In an embodiment of the invention, the input signal In_Sig may also indicate a control value corresponding to one of the two clock signals, such as the aforementioned control value α, and the other control value corresponding to the other clock signal may be derived from the input signal In_Sig. For example, if the input signal In_Sig indicates that the control value corresponding to the first clock signal CK_1 is α, then the other control value (1−α) corresponding to the second clock signal CK_2 may be directly derived from the input signal In_Sig, wherein the control values α and (1−α) may also be regarded as the strength (driving strength) of the corresponding clock signals, and in this example, the ratio of the strength of the first clock signal CK_1 to the second clock signal CK_2 or the ratio of the weighing is α/(1−α).

In the embodiment of the invention, the control circuit 410 may convert the input signal In_Sig to generate an encoded signal comprising a plurality of bits, and adjust the arrangement of the bits according to a pointer to generate a control signal Ctrl_Sig comprising a plurality of control bits. In one embodiment of the invention, the control signal Ctrl_Sig may be a shifted version of the encoded signal. In addition, in an embodiment of the invention, the arrangement of bits (i.e., the control bits) of the control signal Ctrl_Sig may different from the arrangement of bits of the encoded signal.

Figure 5:
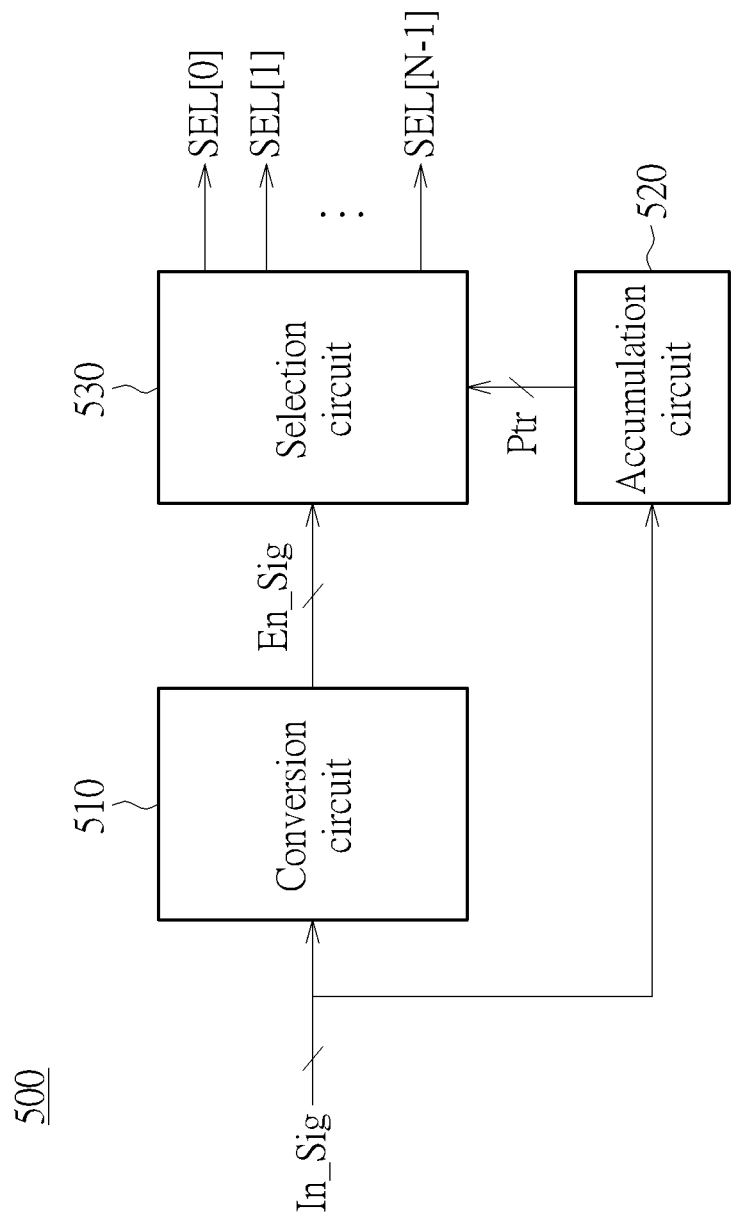
FIG. 5 shows an exemplary block diagram of a control circuit according to an embodiment of the invention.

FIG. 5 shows an exemplary block diagram of a control circuit according to an embodiment of the invention. The control circuit 500 may comprise a conversion circuit 510, an accumulation circuit 520 and a selection circuit 530. The conversion circuit 510 may be configured to convert the input signal into an encoded signal En_Sig having a thermal code format. The input signal In_Sig is a control signal for controlling the magnitude of the driving current generated by the driving circuit of the phase interpolator. Therefore, in the embodiment of the invention, the input signal In_Sig may indicate the strength (driving strength) of at least one of the first clock signal CK_1 and the second clock signal CK_2 as described above, or a ratio of strength or weighing of the first clock signal CK_1 to the second clock signal CK_2, or may indicate the control value corresponding to each clock signal. The input signal In_Sig may be a digital signal having a specific format. For example, the input signal In_Sig may be a binary encoded signal, and the conversion circuit 510 may be configured to convert the input signal In_Sig from a binary code format into a thermal code format. For example, suppose that the binary encoded input signal In_Sig is a 4-bit digital signal, after the aforementioned conversion, the encoded signal En_Sig is a 16-bit digital signal in a thermal code format.

The accumulation circuit 520 may receive the input signal In_Sig and accumulate the value corresponding to the current input signal In_Sig in each driving period to generate a pointer Ptr. Referring back to FIG. 3, assuming that N=16, which means that the driving circuit 300 may comprise 16 driving units, the input signal In_Sig may indicate how many driving units to be turned on in the next driving period, and the number of driving units to be turned on may reflect the driving capability of the driving circuit, also reflect and the strength of the corresponding clock signal.

Assuming that the plurality of bits comprised in the binary encoded input signal In_Sig are set to 0010, which means that there will be two driving units to be turned on in the next driving period. Therefore, the value corresponding to the current input signal In_Sig is 2, the conversion circuit 510 may convert the binary encoded 0010 into the thermal code encoded signal En_Sig. In this case, the plurality of bits comprised in the encoded signal En_Sig will be set to 0000000000000011. The accumulation circuit 520 may accumulate the value corresponding to the current input signal In_Sig, such as the aforementioned value 2, to generate the pointer Ptr. It is be noted that, in some alternatively embodiments of the invention, the accumulation circuit 520 may also receive the encoded signal En_Sig and accumulate the values of the plurality of bits of the encoded signal En_Sig to generate the pointer Ptr. The same result of accumulating the value 2 may be achieved as in the embodiment where the accumulation circuit 520 is configured to receive the input signal In_Sig.

The selection circuit 530 may receive the encoded signal En_Sig and the pointer Ptr, and rotate the plurality of bits of the encoded signal En_Sig according to the value of the pointer Ptr to generate the control signal Ctrl_Sig. As mentioned above, the control signal Ctrl_Sig may be a shifted version of the encoded signal En_Sig, and the amount of shift or displacement the plurality of control bits with respect to the plurality of bits of the encoded signal is related to the current value of the pointer Ptr.

Figure 6:
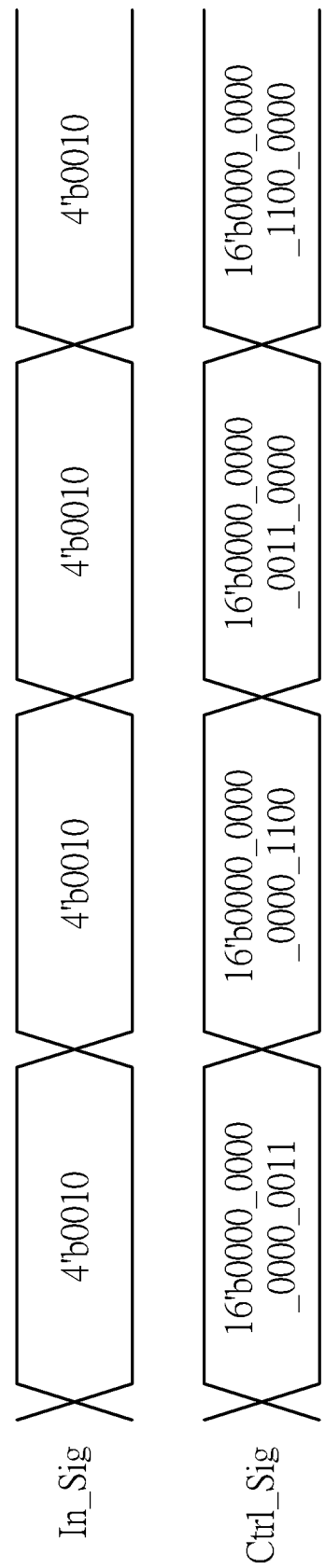
FIG. 6 is a schematic diagram showing the bit values of the input signal and the control signal according to an embodiment of the invention.

FIG. 6 is a schematic diagram showing the bit values of the input signal In_Sig and the control signal Ctrl_Sig according to an embodiment of the invention. FIG. 6 shows the setting values of the bits of the input signal In_Sig and the control signal Ctrl_Sig in four consecutive driving periods, wherein one driving period corresponds to one clock cycle of the clock signal CK_1, CK_2 or CK_OUT. In this example, the values of the four bits of the input signal In_Sig are all set to 4'b0010 in four consecutive driving periods, and the label 4'b is drawn to indicate that the input signal In_Sig contains 4 bits, and the label 16'b is drawn to indicate the control signal Ctrl_Sig contains 16 bits. After being processed by the selection circuit 530, the values of the 16 control bits of the control signal Ctrl_Sig are respectively set to 16'b0000_0000_0000_0011, 16'b0000_0000_0000_1100, 16'b0000_0000_0011_0000, and 16'b0000_0000_1100_0000.

As can be seen from the above example, in the embodiment of the invention, since the value corresponding to the current input signal In_Sig is 2, the selection circuit 530 rotates the 16 bits encoded signal En_Sig according to the value of the pointer Ptr (whose value is now 2), so that the bits of the encoded signal En_Sig are shifted left by 2 bits in each driving period, which is equivalent to that the amount of shift or displacement the bits is 2 between each two adjacent driving periods, or that, with respect to the first driving period or with respect to the original bits in the encoded signal, the amount of shift or displacement of the control bits in the control signal Ctrl_Sig from the second driving period to the fourth driving period is respectively 2, 4 and 6.

Referring back to FIG. 5, the selection circuit 530 provides the plurality of control bits of the control signal Ctrl_Sig, for example, the control bits SEL[0], SEL[1] . . . SEL[N−1], to the corresponding driving units, respectively, so that each driving unit may be switched on or off in response to the setting value of the corresponding control bit as the example shown in FIG. 3.

In an embodiment of the invention, it is assumed that the plurality of control bits of the control signal Ctrl_Sig comprise a plurality of first control bits for controlling the first driving units corresponding to the first clock signal CK_1 and a plurality of second control bits for controlling the second driving units corresponding to the second clock signal CK_2, the first driving units will be turned on or off in response to the values of the first control bits comprised in the control bits and the second driving units will be turned on or off in response to the values of the second control bits comprised in the control bits, and after being processed by the selection circuit 530, the bit(s) in the encoded signal En_Sig that has/have been set (for example, the bit(s) with the bit value being set to 1) will be shifted left according to the current value of the pointer Ptr in each driving period, so as to generate the corresponding control signal Ctrl_Sig. In this manner, the first driving units in the driving circuit will be turned on by turns in consecutive driving periods. Similarly, the second driving units will also be turned on by turns in consecutive driving periods.

To be more specific, in an embodiment of the invention, under the control of the control signal Ctrl_Sig, one or more first driving units that is/are turned on in a first driving period will be turned off in a second driving period subsequent to the first driving period. Similarly, one or more second driving units that is/are turned on in a first driving period will be turned off in a second driving period subsequent to the first driving period. In addition, assuming that a predetermined number of first driving units will be turned on in response to a predetermined strength indicated by the input signal In_Sig, then under the same setting of the predetermined strength, the predetermined number of first driving units that are turned on in a first driving period in response to the predetermined strength and the predetermined number of the first driving units that are turned on in a second driving period following the first driving period in response to the same predetermined strength are different first driving units. Similarly, under the same setting of the predetermined strength, a predetermined number of second driving units that are turned on in a first driving period in response to the predetermined strength and the predetermined number of the second driving units that are turned on in a second driving period following the first driving period in response to the same predetermined strength are different second driving units. In other words, under the same setting of a predetermined strength, the predetermined number of first/second driving units that are turned on in adjacent two driving periods will be different driving units.

Since the drive units are turned on by turns, the effect of Data-Weighted Averaging (DWA) is achieved, so that the errors caused by the differences in the characteristics of each device can be compensated or averaged, which effectively reduces the occurrence of phase errors.

It is to be noted that, in the embodiment of the invention, the phase interpolator configured in the clock generating circuit is not limited to the current-type phase interpolator described above, and may also be a voltage-type phase interpolator, or any other type of phase interpolator.

Figure 7:
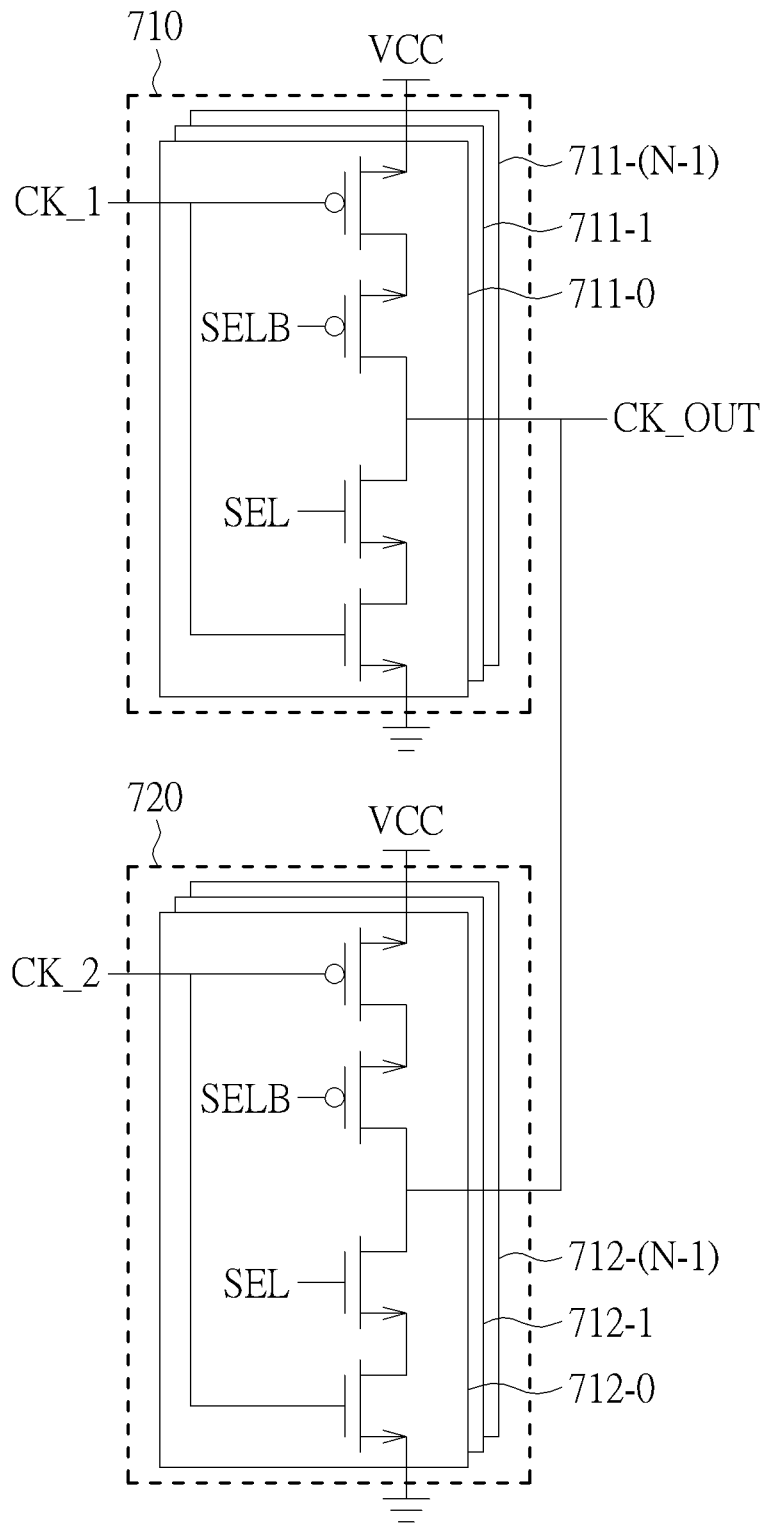
FIG. 7 shows an exemplary circuit diagram of a phase interpolator according to another embodiment of the invention.

FIG. 7 shows an exemplary circuit diagram of a phase interpolator according to another embodiment of the invention. In this example, the phase interpolator is a voltage type phase interpolator. The phase interpolator 700 may comprise a driver circuit 710 and a driver circuit 720. The driving circuits 710 and 720 are coupled to the voltage source VCC, and may respectively comprise a plurality of driving units 711-0, 711-1 ... 711-(N−1) and 712-0, 712-1 ... 712-(N−1). Each driving unit may be a buffer circuit composed of one or more inverters, and may comprise an input stage for receiving the corresponding first clock signal CK_1 and the second clock signal CK_2 (for example, the input stage may comprise two input transistors) and an inverter. Each driving unit may receive a control bit of the control signal Ctrl_Sig. For example, the inverter of each driving unit may respectively receive a corresponding control bit and an inverted control bit (represented by symbols SEL and SELb in FIG. 7). Suppose that the plurality of control bits of the control signal Ctrl_Sig comprise a plurality of first control bits configured to control the first driving units corresponding to the first clock signal CK_1 and a plurality of second control bits configured to control the second driving units corresponding to the second clock signal CK_2, the driving unit 711-0 may receive the first one of the first control bits corresponding to the first clock signal CK_1, the driving unit 711-1 may receive the second one of the first control bits corresponding to the first clock signal CK_1, and so on, and the driving unit 712-0 may receive the first one of the second control bits corresponding to the second clock signal CK_2, and the driving unit 712-1 may receive the second one of the second control bits corresponding to the second clock signal CK_2, and so on.

In this example, each driving unit is turned on or off in response to the corresponding control bit, so as to drive the corresponding clock signal. The greater the number of turned on driving units, the stronger the driving strength of the clock signal will be. By controlling the number of the turned on driving units, the driving capabilities of the clock signals CK_1 and CK_2 are respectively controlled, so that the phase of the output clock signal CK_OUT are adjusted accordingly.

In this embodiment, each driving unit may be designed to have the same size (e.g., the aspect ratio of the transistor), therefore, each driving unit may theoretically provide the same driving capability. It is to be noted that the invention is not limited to configure the driving units to have the same driving capability, for example, by configuring the devices of the same size or the current sources of the same size. In other embodiments of the invention, the phase interpolator may also comprise a plurality of groups of driving units with different driving capabilities.

Figure 8:
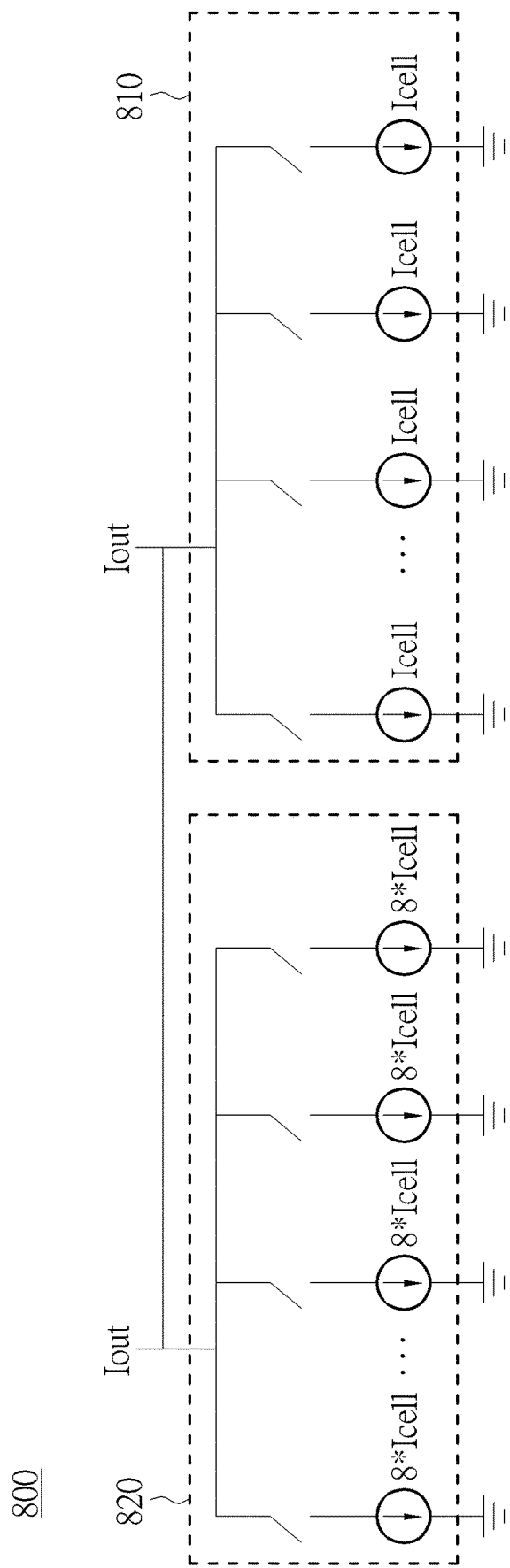
FIG. 8 shows an exemplary circuit diagram of a current-type driving circuit according to another embodiment of the invention.

FIG. 8 shows an exemplary circuit diagram of a current-type driving circuit according to another embodiment of the invention. The driving circuit 800 may comprise two groups of driving units with different driving capabilities, such as the first group of driving units 810 and the second group of driving units 820 shown in FIG. 8. Each driving unit may comprise at least one current source and a corresponding switch device as shown in FIG. 8, wherein the current sources configured in the first group of driving units 810 may be the current sources with the same size and the current sources configured in the second group of driving units 820 may be the current sources with the same size, but the current sources configured in the first group of driving units 810 and the current sources configured in the second group of driving units 820 may be the current sources with different sizes. For example, assuming that the amount of current provided by each current source configured in the first group of driving units 810 is Icell, the amount of current provided by each current source configured in the second group of driving units 820 may be greater than Icell, for example, it may be eight times thereof, that is, 8*Icell. The switch device in each driving unit may also be switched in response to a corresponding control bit in the control signal, thereby controlling the magnitude of the driving current Iout conducted by the driving circuit 800.

In this example, by configuring current sources with different sizes and accompanying with a conversion circuit to convert the input signal in a multi-step manner, the number of control bits and the circuit size required for the selection circuit may be effectively reduced.

An example is provided for a comparative illustration. In this example, it is assumed that the binary encoded input signal In_Sig is a 6-bit digital signal. Since the encoded signal En_Sig obtained by directly converting the 6-bit input signal In_Sig into a thermal code format will comprise 64 bits, in the embodiment when implementing a driving circuit by configuring only the driving units with the same driving capability, 64 driving units will be required, and the circuit size occupied by the corresponding selection circuit is also increased as the number of bits of the input signal In_Sig increases.

In this example, when the conversion circuit is configured to convert the input signal in two steps, the number of control bits and the circuit size required by the selection circuit will be greatly reduced. To be more specific, the conversion circuit may divide the 6 bits of the input signal In_Sig into two groups, comprising a first group of three less significant bits and a second group of three more significant bits. For example, the first three bits of the input signal In_Sig starting from the most significant bit (MSB) are selected as the second group of three more significant bits, and the remaining bits are selected as the first group of three less significant bits.

The conversion circuit may perform thermal code format conversion and bit rotation on the obtained two groups of bits (e.g., the first group of less significant bits and the second group of more significant bits), respectively, to generate two control signals, and each control signal may comprise 8 bits. The control signal generated based on the less significant bits may be provided to the first group of driving units 810, and the control signal generated based on the more significant bits may be provided to the second group of driving units 820. In this manner, the phase interpolator only needs two 8-bit wide control signals and may be configured with at most 8 driving units in each of the two groups of driving units to drive the current sources so as to effectively control the drive capability of the clock signal. In addition, the driving units in each group may be turned on by turns in consecutive driving periods based on the bit rotation mechanism as described above, achieving the effect of data weighted average (DWA).

Based on the same operation concept, the phase interpolator may also be configured with more than two groups of driving units with different driving capabilities, and accompanying with a conversion circuit to convert the input signal into an encoded signal having a thermal code format in a multi-step manner and then a selection circuit to rotate the bits of the encoded signal according to the pointer, the bit arrangement of the encoded signal is adjusted and the corresponding control signal is generated, so that each driving circuit or the driving units in each group of driving units will be turned on by turns in several consecutive driving periods as described above, achieving the effect of data weighted average (DWA).

Figure 9:
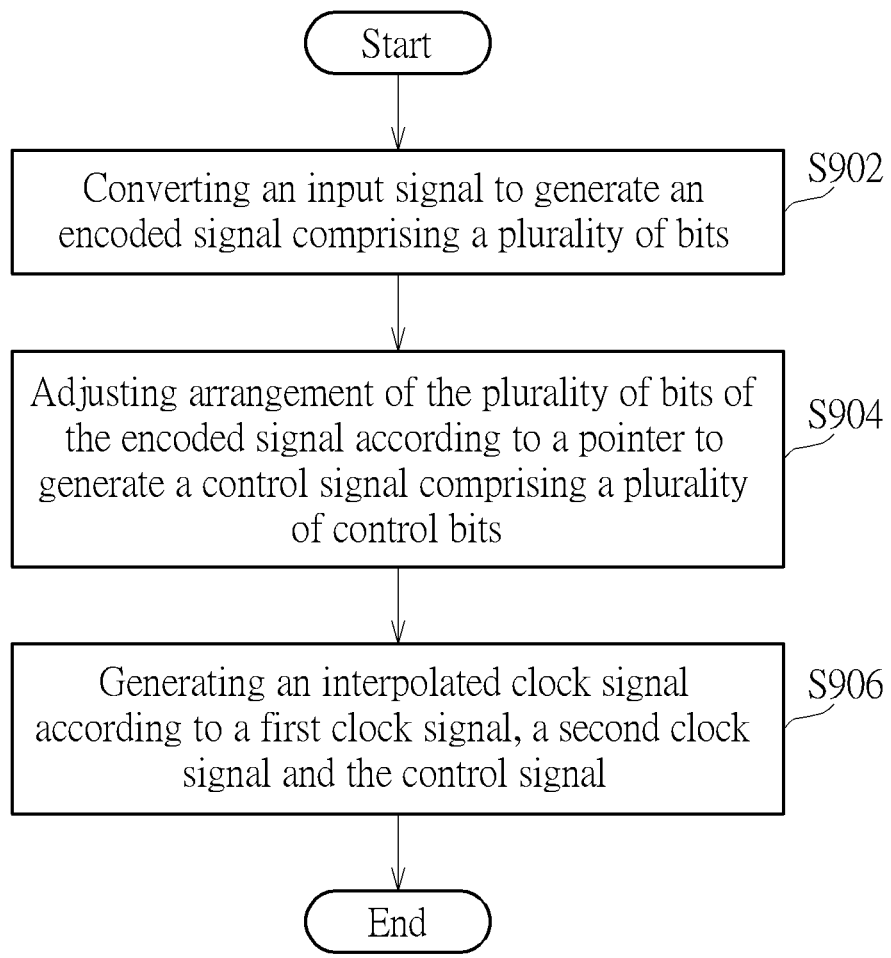
FIG. 9 shows an exemplary flowchart of a method for generating a clock signal according to an embodiment of the invention.

FIG. 9 shows an exemplary flowchart of a method for generating a clock signal according to an embodiment of the invention. The method for generating a clock signal may comprise the following steps performed by a clock generating circuit (e.g., the clock generating circuit as shown in FIG. 4):

Step S902: Converting an input signal to generate an encoded signal comprising a plurality of bits.

Step S904: Adjusting arrangement of the plurality of bits of the encoded signal according to a pointer to generate a control signal comprising a plurality of control bits; and Step S906: Generating an interpolated clock signal according to a first clock signal, a second clock signal and the control signal. In step S906, the driving circuits for driving the clock signals in the phase interpolator or the driving units in each group of driving units in the phase interpolator for driving the clock signals will be turned on by turns in several consecutive driving periods in response to the corresponding control bits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generating circuit comprising:
a control circuit configured to receive and convert an input signal to generate an encoded signal comprising a plurality of bits, and the control circuit further configured to adjust arrangement of the plurality of bits of the encoded signal according to a pointer to generate a control signal comprising a plurality of control bits; and
a phase interpolator configured to receive a first clock signal, a second clock signal and the control signal, the phase interpolator comprising:
a first driving circuit configured to receive the first clock signal, the first driving circuit comprising a plurality of first driving units, wherein the plurality of first driving units are turned on or off to drive the first clock signal in response to a plurality of first control bits in the plurality of control bits;
a second driving circuit configured to receive the second clock signal, the second driving circuit comprising a plurality of second driving units, wherein the plurality of second driving units are turned on or off to drive the second clock signal in response to a plurality of second control bits in the plurality of control bits; and
an output terminal coupled to the first driving circuit and the second driving circuit, the output terminal configured to output an interpolated clock signal.

2. The clock generating circuit of claim 1, wherein one or more of the plurality of first driving units that are turned on in a first driving period are turned off in a second driving period subsequent to the first driving period.

3. The clock generating circuit of claim 1, wherein the input signal indicates a strength of the first clock signal and a first predetermined number of the plurality of first driving units are turned on in response to a predetermined strength of the first clock signal, and wherein the first predetermined number of the plurality of first driving units that are turned on in a first driving period, and the first predetermined number of the plurality of first driving units that are turned on in a second driving period following the first driving period are different.

4. The clock generating circuit of claim 1, wherein the plurality of first driving units and the plurality of second driving units respectively comprise at least one current source.

5. The clock generating circuit of claim 1, wherein the plurality of first driving units and the plurality of second driving units are respectively a buffer circuit composed of one or more inverters.

6. The clock generating circuit of claim 1, wherein the encoded signal is a signal having a thermal code format.

7. The clock generating circuit of claim 1, wherein the control circuit is further configured to accumulate the input signal to generate the pointer.

8. The clock generating circuit of claim 1, wherein the control circuit is further configured to rotate the plurality of bits according to the pointer to generate the control signal, and wherein an amount of shift of the plurality of control bits with respect to the plurality of bits of the encoded signal is related to a value of the pointer.

9. A method for generating a clock signal, the method comprising:
converting, by a control circuit, an input signal to generate an encoded signal comprising a plurality of bits;

adjusting, by the control circuit, arrangement of the plurality of bits of the encoded signal according to a pointer to generate a control signal comprising a plurality of control bits; and generating, by a phase interpolator, an interpolated clock signal according to a first clock signal, a second clock signal and the control signal, wherein in the step of generating the interpolated clock signal according to the first clock signal, the second clock signal and the control signal, a plurality of first driving units of the phase interpolator and a plurality of second driving units of the phase interpolator are respectively turned on or off in response to a plurality of first control bits and a plurality of second control bits in the plurality of control bits to respectively drive the first clock signal and the second clock signal.

10. The method for generating the clock signal of claim 9, wherein one or more of the plurality of first driving units that are turned on in a first driving period are turned off in a second driving period subsequent to the first driving period.

11. The method for generating the clock signal of claim 9, wherein the input signal indicates a strength of the first clock signal and a first predetermined number of the plurality of first driving units are turned on in response to a predetermined strength of the first clock signal, and wherein the first predetermined number of the plurality of first driving units that are turned on in a first driving period, and the first predetermined number of the plurality of first driving units that are turned on in a second driving period following the first driving period are different.

12. The method for generating the clock signal of claim 9, wherein the plurality of first driving units and the plurality of second driving units respectively comprise at least one current source.

13. The method for generating the clock signal of claim 9, wherein the plurality of first driving units and the plurality of second driving units are respectively a buffer circuit composed of one or more inverters.

14. The method for generating the clock signal of claim 9, wherein the encoded signal is a signal having a thermal code format.

15. The method for generating the clock signal of claim 9, further comprising: accumulating, by the control circuit, the input signal to generate the pointer.

16. The method for generating the clock signal of claim 9, wherein the step of adjusting arrangement of the plurality of bits of the encoded signal according to the pointer to generate the control signal comprising the plurality of control bits further comprises: rotating, by the control circuit, the plurality of bits according to the pointer to generate the control signal, wherein an amount of shift of the plurality of control bits with respect to the plurality of bits of the encoded signal is related to a value of the pointer.

* * * * *